(12) United States Patent
Yamaguchi (10) Patent No.: US 7,135,762 B2
(45) Date of Patent: Nov. 14, 2006

(54) SEMICONDUCTOR DEVICE, STACKED SEMICONDUCTOR DEVICE, METHODS OF MANUFACTURING THEM, CIRCUIT BOARD, AND ELECTRONIC INSTRUMENT

(75) Inventor: Koji Yamaguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 210 days.

(21) Appl. No.: 10/844,415

(22) Filed: May 13, 2004

(65) Prior Publication Data

US 2005/0001320 A1    Jan. 6, 2005

(30) Foreign Application Priority Data

May 19, 2003   (JP) ............................. 2003-140580

(51) Int. Cl.
*H01L 23/02* (2006.01)

(52) U.S. Cl. ............................. 257/686; 257/E23.085; 438/109

(58) Field of Classification Search ................ 257/686; 438/109
See application file for complete search history.

(56) References Cited

U.S. PATENT DOCUMENTS 6,429,096 B1 *   8/2002   Yanagida ................ 438/459
6,660,545 B1 * 12/2003   Furusawa ................ 438/21

FOREIGN PATENT DOCUMENTS

| JP | 2000-277689 A | 10/2000 |
| JP | 2000-311982 A | 11/2000 |
| JP | A 2001-135780 | 5/2001 |

* cited by examiner

*Primary Examiner*—Asok Kumar Sarkar
(74) *Attorney, Agent, or Firm*—Oliff & Berridge, PLC (57) ABSTRACT

A semiconductor device including: a semiconductor substrate having an integrated circuit and a penetrating hole; an insulating layer formed on an inner surface of the penetrating hole; and a conductive section formed on the insulating layer to penetrate the semiconductor substrate and having a recess on an end surface.

21 Claims, 7 Drawing Sheets

SEMICONDUCTOR DEVICE, STACKED SEMICONDUCTOR DEVICE, METHODS OF MANUFACTURING THEM, CIRCUIT BOARD, AND ELECTRONIC INSTRUMENT

Japanese Patent Application No. 2003-140580, filed on May 19, 2003, is hereby incorporated by reference in its entirety.

BACKGROUND OF THE INVENTION

The present invention relates to a semiconductor device, a stacked semiconductor device, methods of manufacturing such a semiconductor device or a stacked semiconductor device, a circuit board, and an electronic instrument.

A semiconductor device with a three-dimensional mounting configuration has been developed. It is known in the art that a penetrating electrode is formed in a semiconductor substrate in order to enable three-dimensional mounting. In the case of stacking a plurality of semiconductor substrates, it is preferable to form the penetrating electrode in each semiconductor substrate in the shape suitable for electrical connection.

BRIEF SUMMARY OF THE INVENTION

According to a first aspect of the present invention, there is provided a semiconductor device comprising:

a semiconductor substrate having an integrated circuit and a penetrating hole;

an insulating layer formed on an inner surface of the penetrating hole; and a conductive section formed on the insulating layer to penetrate the semiconductor substrate and having a recess on an end surface.

According to a second aspect of the present invention, there is provided a stacked semiconductor device comprising:

a plurality of the semiconductor devices as defined in claim 1 which are stacked, wherein electrical connection of the semiconductor devices are achieved through the conductive sections.

On a circuit board according to a third aspect of the present invention, the above semiconductor device is mounted.

An electronic instrument according to a fourth aspect of the present invention comprises the above semiconductor device.

According to a fifth aspect of the present invention, there is provided a method of manufacturing a semiconductor device, comprising:

(a) forming a hole in a semiconductor substrate which has an integrated circuit;

(b) forming an insulating layer on an inner surface of the hole;

(c) forming a conductive section on the insulating layer; and (d) forming a recess on an end surface of the conductive section.

According to a sixth aspect of the present invention, there is provided a method of manufacturing a stacked semiconductor device, comprising:

stacking a plurality of semiconductor devices each of which includes: a semiconductor substrate having an integrated circuit and a penetrating hole; an insulating layer formed on an inner surface of the penetrating hole; and a conductive section formed on the insulating layer to penetrate the semiconductor substrate and having a recess on an end surface; and achieving electrical connection of the semiconductor devices through the conductive sections.

DETAILED DESCRIPTION OF THE

EMBODIMENTS

The present invention may provide a highly reliable semiconductor device, a stacked semiconductor device, a method of manufacturing such a semiconductor device or a stacked semiconductor device, a circuit board, and an electronic instrument.

(1) According to one embodiment of the present invention, there is provided a semiconductor device comprising:

a semiconductor substrate having an integrated circuit and a penetrating hole;

an insulating layer formed on an inner surface of the penetrating hole; and a conductive section formed on the insulating layer to penetrate the semiconductor substrate and having a recess on an end surface.

Since the conductive section of this semiconductor device includes the recess on the end surface, the area of the end surface is increased, and electrical connection reliability can be improved. Moreover, since a conductive material can enter the recess, the semiconductor device is rarely influenced by external force. Therefore, a highly reliable semiconductor device can be provided.

(2) In this semiconductor device, a pad electrically connected to the integrated circuit may be formed on a first surface of the semiconductor substrate; and the end surface may be exposed from a second surface of the semiconductor substrate opposite to the first surface.

(3) In this semiconductor device, the recess may have an internal space the width of which is larger than the width of an opening of the recess. This enables to increase the surface area of the recess and to make the conductive material within the recess difficult to be pulled out. Therefore, a semiconductor device with higher reliability can be provided.

(4) In this semiconductor device, the end surface may be an uneven surface including a plurality of the recesses. Since the area of the end surface is increased, electrical connection reliability can be improved. Moreover, since a conductive material can enter the recess, the semiconductor device is rarely influenced by external force. Therefore, a highly reliable semiconductor device can be provided.

(5) In this semiconductor device, the end surface may be more uneven than the other end surface of the conductive section.

(6) In this semiconductor device, an end portion of the conductive section having the end surface including the recess may project from the semiconductor substrate; and the recess may have such a depth that a bottom of the recess is positioned inside the semiconductor substrate. Since this enables to make the recess deeper, a semiconductor device with higher reliability can be provided.

(7) According to one embodiment of the present invention, there is provided a stacked semiconductor device comprising:

a plurality of the semiconductor devices as defined in claim 1 which are stacked, wherein electrical connection of the semiconductor devices are achieved through the conductive sections.

This embodiment is enabled by stacking a semiconductor device having a conductive section in which a recess is formed on an end surface. Therefore, a stacked semiconductor device with high electrical reliability and reliability against external force can be provided.

(8) The stacked semiconductor device may further comprise a conductive material which partially enters the recesses to connect the conductive sections of vertically adjacent semiconductor devices among the semiconductor devices. This enables to provide a stacked semiconductor device with higher reliability.

(9) On a circuit board according to one embodiment of the present invention, any of the above semiconductor devices is mounted.

(10) An electronic instrument according to one embodiment of the present invention comprises any of the above semiconductor devices.

(11) According to one embodiment of the present invention, there is provided a method of manufacturing a semiconductor device, comprising:

(a) forming a hole in a semiconductor substrate which has an integrated circuit;

(b) forming an insulating layer on an inner surface of the hole;

(c) forming a conductive section on the insulating layer; and (d) forming a recess on an end surface of the conductive section.

This enables to manufacture a semiconductor device having a conductive section in which a recess is formed on an end surface, so that the area of the end surface is increased, and electrical connection reliability can be improved. Moreover, since a conductive material can enter the recess, the semiconductor device is rarely influenced by external force. Therefore, a highly reliable semiconductor device can be provided.

(12) In this method of manufacturing a semiconductor device, the hole may be formed so as not to penetrate the semiconductor substrate in the step (a); and the end surface is exposed from the semiconductor substrate after the step (c).

(13) In this method of manufacturing a semiconductor device, the hole may be formed to penetrate the semiconductor substrate in the step (a).

(14) In this method of manufacturing a semiconductor device, a pad electrically connected to the integrated circuit may be formed on a first surface of the semiconductor substrate; and the end surface may be exposed from a second surface of the semiconductor substrate opposite to the first surface.

(15) In this method of manufacturing a semiconductor device, the conductive section may be formed to have a void in the step (c); and the recess may be formed by removing part of the end surface of the conductive section and opening the void in the step (d).

(16) In this method of manufacturing a semiconductor device, the recess may be formed to have an internal space the width of which is larger than the width of an opening of the recess in the step (d). This enables to increase the surface area of the recess and to make the conductive material within the recess difficult to be pulled out. Therefore, a semiconductor device with higher reliability can be provided.

(17) In this method of manufacturing a semiconductor device, the end surface may be made uneven to have a plurality of the recesses in the step (d). Since the area of the end surface is increased, electrical connection reliability can be improved. Moreover, since a conductive material can enter the recess, the semiconductor device is rarely influenced by external force. Therefore, a highly reliable semiconductor device can be provided.

(18) In this method of manufacturing a semiconductor device, the end surface may be made more uneven than the other end surface of the conductive section in the step (d).

(19) In this method of manufacturing a semiconductor device, an end portion of the conductive section having the end surface including the recess may project from the semiconductor substrate; and the recess may be formed to have such a depth that a bottom of the recess is positioned inside the semiconductor substrate in the step (d).

Since this enables to make the recess deeper, a semiconductor device with higher reliability can be provided.

(20) In this method of manufacturing a semiconductor device, the step (d) may include removing part of the end surface by etching.

(21) In this method of manufacturing a semiconductor device, the semiconductor substrate may be a semiconductor wafer including a plurality of integrated circuits;

the hole may be formed for each of the integrated circuits; and the semiconductor substrate may be cut after the step (d).

(22) According to one embodiment of the present invention, there is provided a method of manufacturing a stacked semiconductor device, comprising:

stacking a plurality of semiconductor devices each of which includes: a semiconductor substrate having an integrated circuit and a penetrating hole; an insulating layer formed on an inner surface of the penetrating hole; and a conductive section formed on the insulating layer to penetrate the semiconductor substrate and having a recess on an end surface; and achieving electrical connection of the semiconductor devices through the conductive sections.

This embodiment is enabled by stacking a semiconductor device having a conductive section in which a recess is formed on an end surface. Therefore, a stacked semiconductor device with high electrical reliability and reliability against external force can be provided.

(23) In this method of manufacturing a stacked semiconductor device, a conductive material may partially enter the recesses to connect the conductive sections of vertically adjacent semiconductor devices among the semiconductor devices. This enables to provide a stacked semiconductor device with higher reliability.

The embodiments of the present invention are described below with reference to the drawings. Note that the present invention is not limited to the following embodiments.

First Embodiment

FIGS. 1 to 6 are diagrams showing a method of manufacturing a semiconductor device according to a first embodiment to which the present invention is applied. A semiconductor substrate 10 is provided (see FIG. 1). The semiconductor substrate 10 may be provided in the form of a semiconductor chip, or provided in the form of a semiconductor wafer. At least one integrated circuit 12 (circuit including a transistor or memory, for example) is formed in the semiconductor substrate 10 (one integrated circuit 12 is formed in a semiconductor chip, and a plurality of integrated circuits 12 are formed in a semiconductor wafer).

Figure 1:
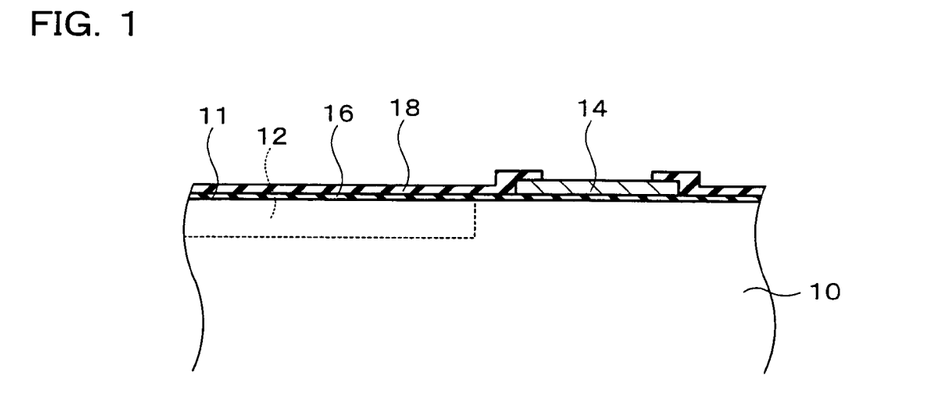
FIG. 1 is a diagram for illustrating a method of manufacturing a semiconductor device according to the first embodiment of the present invention.
Figure 2:
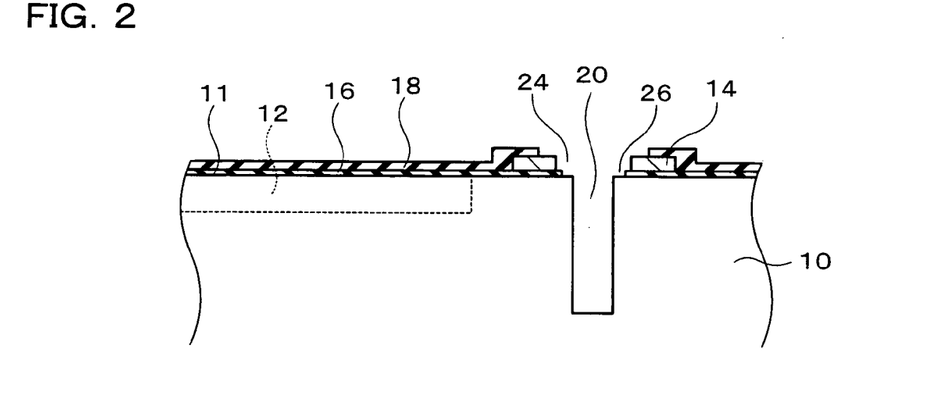
FIG. 2 is a diagram for illustrating a method of manufacturing a semiconductor device according to the first embodiment of the present invention.

A plurality of pads 14 may be formed on the semiconductor substrate 10. The pad 14 may be electrically connected with the integrated circuit 12. The pad 14 may be called an electrode pad. The pad 14 may be formed of aluminum. There are no specific limitations to the planar shape of the pad 14. The planar shape of the pad 14 is generally quadrilateral. In the case where the semiconductor substrate 10 is a semiconductor wafer, at least two (one group of) pads 14 are formed in each region which becomes a semiconductor chip. The surface of the semiconductor substrate 10 on which the pads 14 are formed may be called a first surface 11.

At least one layer of an insulating film may be formed on the semiconductor substrate 10. The insulating film may be formed on the first surface 11 of the semiconductor substrate 10. In the example shown in FIG. 1, insulating films 16 and 18 are formed on the semiconductor substrate 10. The pad 14 and an interconnect (not shown) which connects the integrated circuit 12 with the pad 14 are formed on the insulating film 16. The insulating film 18 may be formed on the insulating film 16 so as to avoid at least a part of the pad 14. The insulating layer 18 may be formed to cover the surface of the pad 14, and a part of the pad 14 may be exposed by etching a part of the insulating layer 18. The insulating film 18 may be etched by either dry etching or wet etching. The insulating film 16 may be formed of an oxide film. The insulating film 18 may be called a passivation film, and may be formed of SiN, $SiO_2$, a polyimide resin, or the like.

A hole 20 is formed in the semiconductor substrate 10. In the case where the semiconductor substrate 10 is provided as a semiconductor wafer, the hole 20 may be formed corresponding to each integrated circuit 12. In a method of manufacturing the semiconductor device according to the present embodiment, the hole 20 is formed so as not to be formed through the semiconductor substrate 10 (see FIG. 2). Therefore, the hole 20 may be called a recess. The hole 20 may be formed to have a portion in which the cross section in almost the same shape continues in the direction of the thickness of the semiconductor substrate 10. The hole 20 is formed to avoid a device and an interconnect of the integrated circuit 12. The hole 20 may be formed by etching (dry etching or wet etching). Etching may be performed after forming a resist (not shown) patterned by lithography. The hole 20 may be formed to overlap the pad 14 (see FIG. 2). After forming a penetrating hole 24 in the pad 14, the hole 20 may be formed in the region of the penetrating hole 24. In the case where the insulating film 16 is formed under the pad 14, a penetrating hole 26 is formed in the insulating film 16 (see FIG. 2). The penetrating hole 24 (and the penetrating hole 26) may be formed by etching (dry etching or wet etching). A laser ($CO_2$ laser or YAG laser, for example) may be used to form the hole 20. A laser may be used to form the penetrating holes 24 and 26. The hole 20 and the penetrating holes 24 and 26 may be continuously formed by using one type of etchant or laser.

Figure 3:
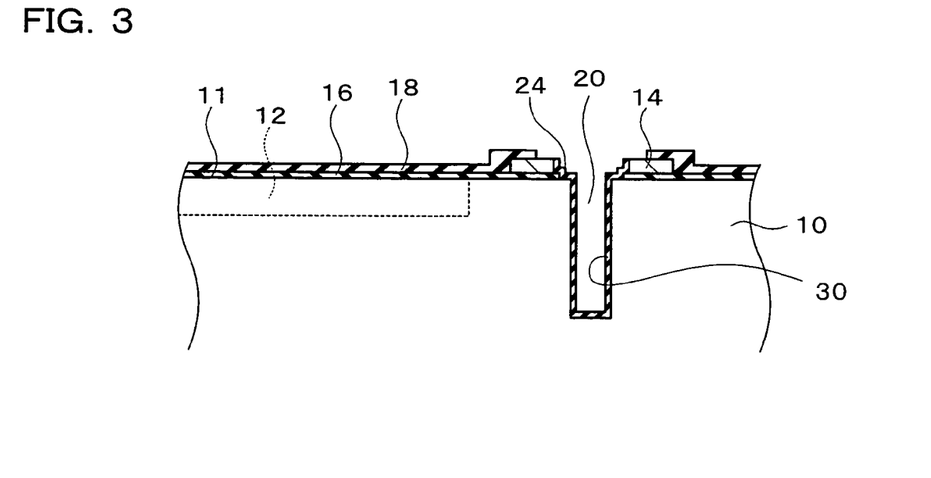
FIG. 3 is a diagram for illustrating a method of manufacturing a semiconductor device according to the first embodiment of the present invention.
Figure 4A:
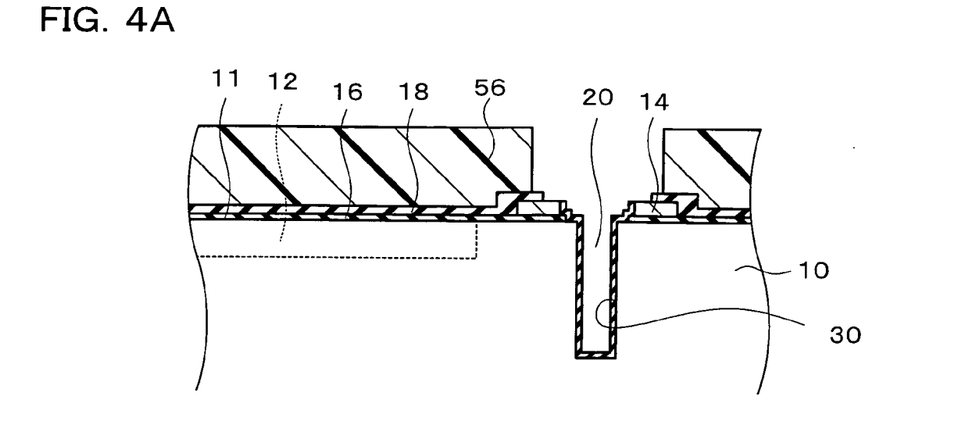
FIGS. 4A and 4B are diagrams for illustrating a method of manufacturing a semiconductor device according to the first embodiment of the present invention.
Figure 4B:
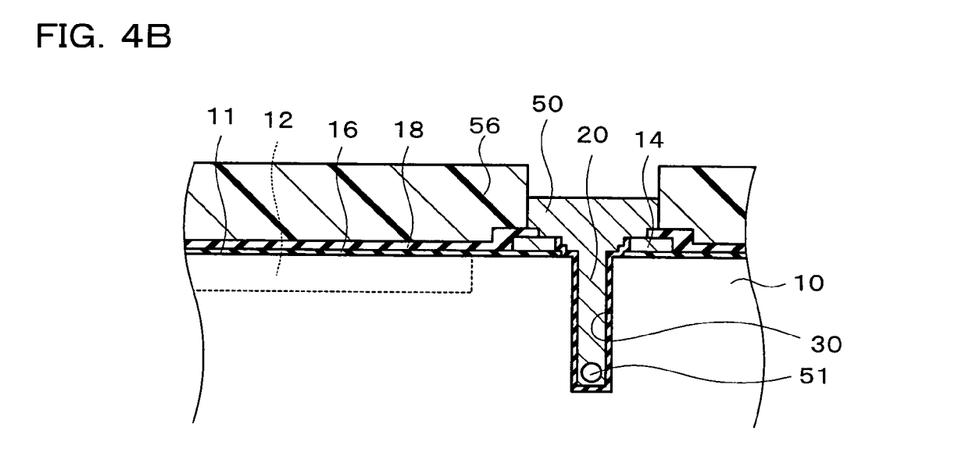

As shown in FIG. 3, an insulating layer 30 is formed on the inner surface of the hole 20. The insulating layer 30 may be an oxide film. In the case where the material for the semiconductor substrate 10 is Si, the insulating layer 30 may be formed of either $SiO_2$ or SiN. The insulating layer 30 may be formed on the inner wall surface of the hole 20. In the present embodiment, since the hole 20 is formed as a recess, the insulating layer 30 may be formed to reach the bottom of the hole 20. The insulating layer 30 may be formed on the inner wall surface of the penetrating hole 24 in the pad 14. The insulating layer 30 is formed to avoid a part (upper surface, for example) of the pad 14. This enables the pad 14 to be electrically connected with a conductive section 50 described later. The insulating layer 30 may be formed on the insulating film 18 (passivation film) (not shown). The insulating layer 30 may be formed to cover the entire surface of the pad 14, and a part of the pad 14 may be exposed by etching (dry etching or wet etching) a part of the insulating layer 30. Etching may be performed after forming a resist (not shown) patterned by lithography.

The conductive section 50 is formed on the semiconductor substrate 10. The conductive section 50 may be formed inside the insulating layer 30. The conductive section 50 may be formed by a step of forming a patterned resist 56 and a step of forming the conductive section 50 in the area exposed from the resist 56. In more detail, after forming a conductive film (not shown) by sputtering or electroless plating from the side of the first surface 11 of the semiconductor substrate 10, the patterned resist 56 is formed (see FIG. 4A). The resist 56 may be patterned by lithography. The conductive section 50 may be formed by electroplating (see FIG. 4B). However, the step of forming the conductive section 50 is not limited thereto. For example, a conventional method such as an ink-jet method may be applied. In the case where the hole 20 is formed to overlap the penetrating hole 24 in the pad 14, the conductive section 50 may be formed through the pad 14 through the penetrating hole 24. This enables the distance between the pad 14 and the conductive section 50 to be reduced, whereby a highly reliable semiconductor device having stable electrical characteristics can be manufactured. There are no specific limitations to the material for the conductive section 50. For example, the conductive section 50 may be formed of Cu. In the method of manufacturing the semiconductor device according to the present embodiment, the conductive section 50 may be formed to have a void 51 (see FIG. 4B). For example, the conductive section 50 may be formed to have the void 51 by controlling current density during electroplating.

Figure 5:
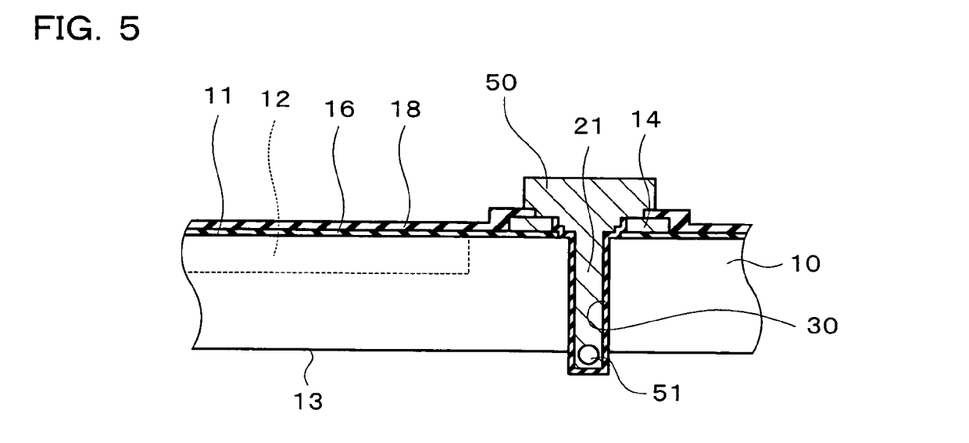
FIG. 5 is a diagram for illustrating a method of manufacturing a semiconductor device according to the first embodiment of the present invention.

An end surface 52 of the conductive section 50 is exposed from the semiconductor substrate 10. As shown in FIG. 5, the end surface 52 of the conductive section 50 may be exposed from a second surface 13 of the semiconductor substrate 10 opposite to the first surface 11. This allows the upper and lower surfaces of the semiconductor substrate 10 to be electrically connected through the conductive section 50. The end surface 52 may be exposed by removing the second surface 13 by mechanical polishing, or removing a part of the second surface 13 by etching, for example. The end surface 52 may be exposed by mechanical polishing and etching. Since the hole 20 is formed through the semiconductor substrate 10, a penetrating hole 21 is formed in the semiconductor substrate 10. The end surface 52 of the conductive section 50 may be exposed by removing a part of the insulating layer 30. A part of the insulating layer 30 may be removed by etching. As shown in FIG. 5, the conductive section 50 may project from the second surface 13. This prevents occurrence of short circuits when stacking the semiconductor substrates 10, whereby a highly reliable stacked semiconductor device can be manufactured.

A recess 60 is formed on the end surface 52 of the conductive section 50. This increases the surface area on the end of the conductive section 50, whereby electrical connection reliability of the conductive section 50 can be increased. Moreover, reliability against external force can be increased by allowing a conductive material to enter the recess 60. Specifically, a semiconductor device having high electrical reliability and reliability against external force can be manufactured. The recess 60 may be formed to have an internal space larger than its opening. This increases the surface area of the recess 60 and prevents removal of the conductive material entering the recess 60, whereby a highly reliable semiconductor device can be manufactured.

Figure 6:
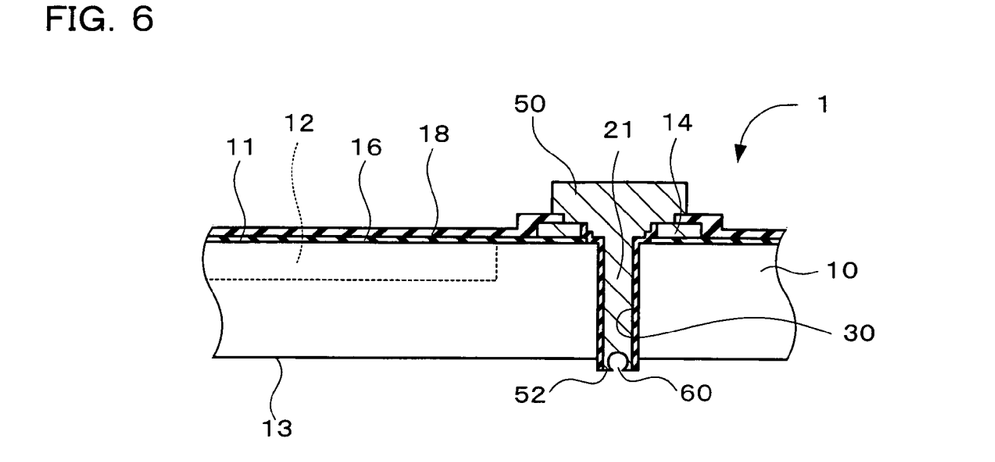
FIG. 6 is a diagram for illustrating a method of manufacturing a semiconductor device according to the first embodiment of the present invention.

In the method of manufacturing the semiconductor device according to the present embodiment, the void 51 may be formed by removing a part of the conductive section 50 from the side of the end surface 52, whereby the recess 60 may be formed. For example, a part of the end surface 52 may be removed by etching the conductive section 50, whereby the recess 60 may be formed. As shown in FIG. 6, the conductive section 50 may be caused to project from the semiconductor substrate 10 on the side of the end surface 52, whereby the recess 60 may be formed to have such a depth that the recess 60 reaches inside the semiconductor substrate 10. This enables the recess 60 to be formed deeper. Therefore, a semiconductor device having high electrical reliability and reliability against external force can be manufactured. The position and the depth of the recess 60 may be controlled by controlling the position and the size of the void 51. The step of forming the recess 60 in the end surface 52 may be performed together with the step of exposing the end surface 52 of the conductive section 50 from the semiconductor substrate 10 (step of removing a part of the insulating layer 30, in particular).

The semiconductor device 1 may be manufactured by these steps (see FIG. 6). In the case where a semiconductor wafer is used as the semiconductor substrate 10, the semiconductor device 1 may be manufactured by performing a step of cutting the semiconductor wafer into individual pieces.

The semiconductor device 1 includes the semiconductor substrate 10. The semiconductor substrate 10 includes the integrated circuit 12 and in which the penetrating hole 21 is formed. The semiconductor device 1 includes the insulating layer 30 formed on the inner surface of the penetrating hole 21. The semiconductor device 1 includes the conductive section 50. The conductive section 50 is formed through the semiconductor substrate 10 while passing inside the insulating layer 30. The end surface 52 of the conductive section 50 includes the recess 51. The configuration obtained by the above-described manufacturing method may be applied to other configurations. The recess 51 is formed on the end surface 52 of the conductive section 50 of the semiconductor device 1. Therefore, a semiconductor device having high electrical reliability and reliability against external force can be manufactured.

Figure 7:
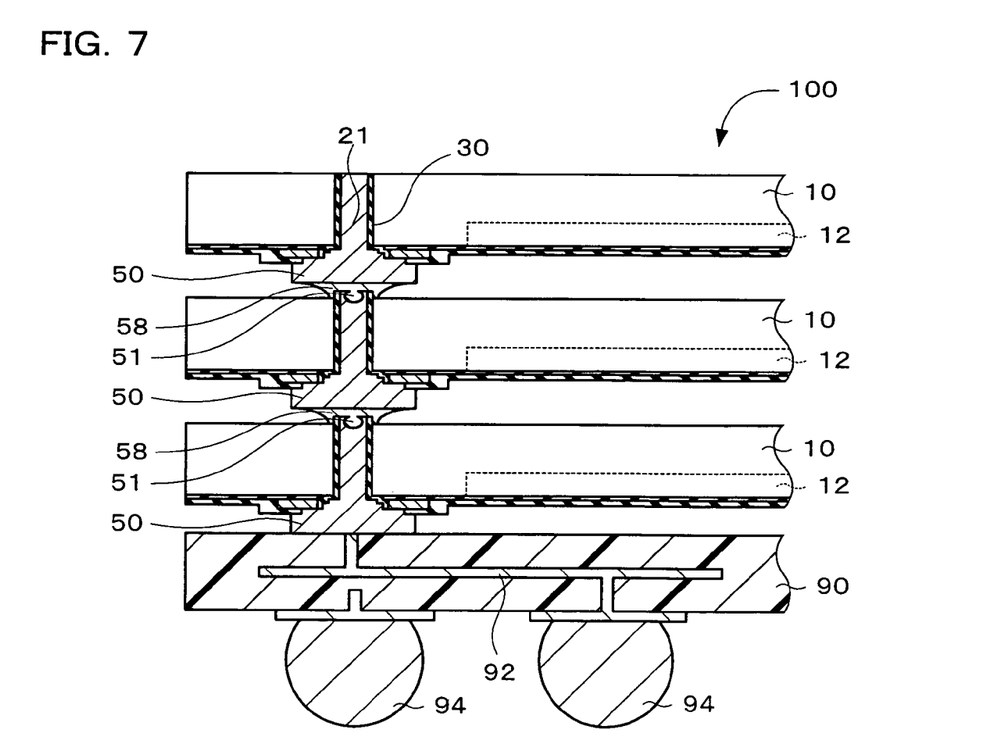
FIG. 7 is a diagram for illustrating a method of manufacturing a semiconductor device according to one embodiment of the present invention.
Figure 9:
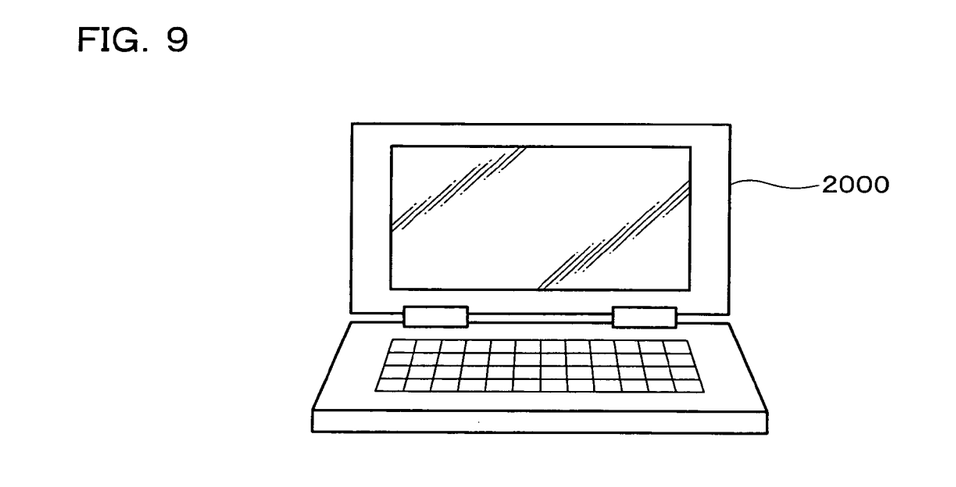
FIG. 9 shows an electronic instrument having a semiconductor device according to one embodiment of the present invention.

FIG. 9 shows a stacked semiconductor device 100. The stacked semiconductor device 100 includes the above-described semiconductor devices which are stacked. The semiconductor devices are electrically connected through the conductive sections 50. A method of manufacturing the stacked semiconductor device 100 includes stacking the semiconductor devices (semiconductor devices 1), each including the semiconductor substrate 10 which includes the integrated circuit 12 and in which the penetrating hole 21 is formed, the insulating layer 30 formed on the inner surface of the penetrating hole 21, and the conductive section 50 which is formed through the semiconductor substrate 10 while passing through inside the insulating layer 30 and includes the recess 60 on the end surface 52, and electrically connecting the semiconductor devices through the conductive sections 50. As shown in FIG. 7, the conductive sections 50 of the upper and lower semiconductor devices 1 may be bonded by causing the conductive material 58 to enter the recess 51 in the conductive section 50. A stacked semiconductor device 100 having high electrical reliability and reliability against external force can be manufactured by causing the conductive material 58 to enter the recess 51.

Figure 8:
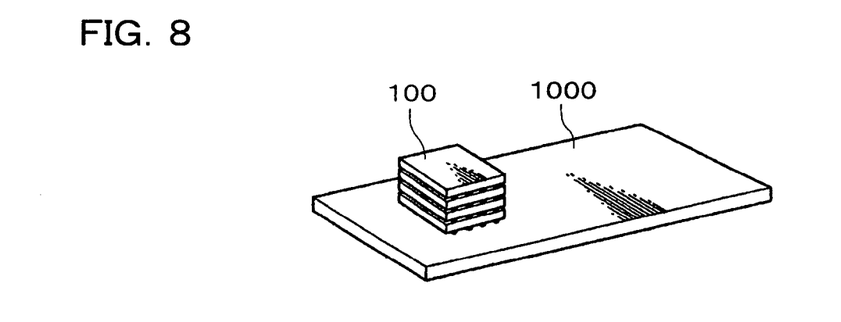
FIG. 8 shows a circuit board on which is mounted a semiconductor device according to one embodiment of the present invention.
Figure 10:
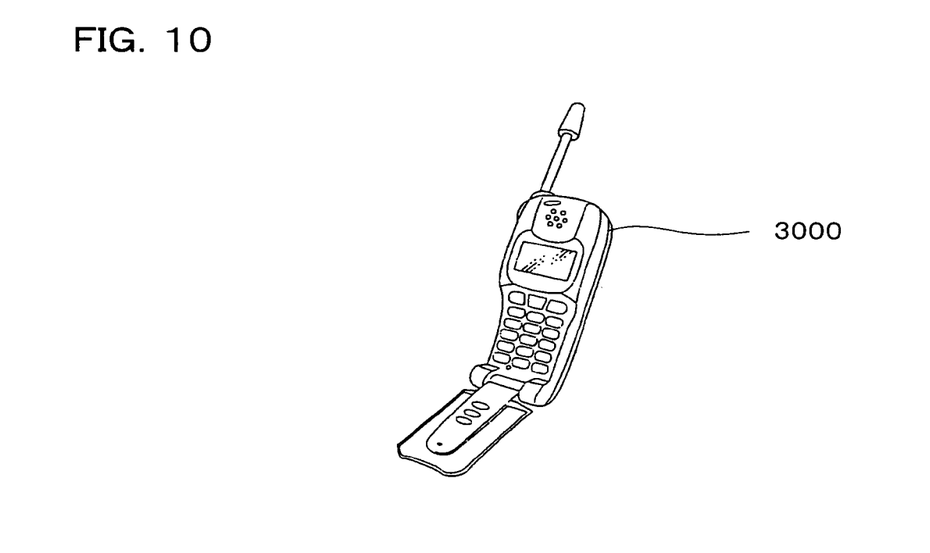
FIG. 10 shows an electronic instrument having a semiconductor device according to one embodiment of the present invention.

The stacked semiconductor device 100 may include an interconnect substrate 90. The stacked semiconductor devices 1 may be mounted on the interconnect substrate 90. A plurality of interconnects 92 may be formed on the interconnect substrate 90. An external terminal 94 may be further formed. This enables the stacked semiconductor device 100, which can be readily mounted on the circuit board or the like, to be provided. An insulating layer (not shown) (which may have a stress relaxation function) may be formed between the stacked semiconductor devices 1. This enables a reliable stacked semiconductor device 100 to be formed. FIG. 8 shows a circuit board 1000 on which the stacked semiconductor device 100 according to the embodiment to which the present invention is applied is mounted. FIGS. 9 and 10 respectively show a notebook-type personal computer 2000 and a portable telephone 3000 as examples of electronic instruments including the semiconductor device according to the embodiment of the present invention.

Figure 11:
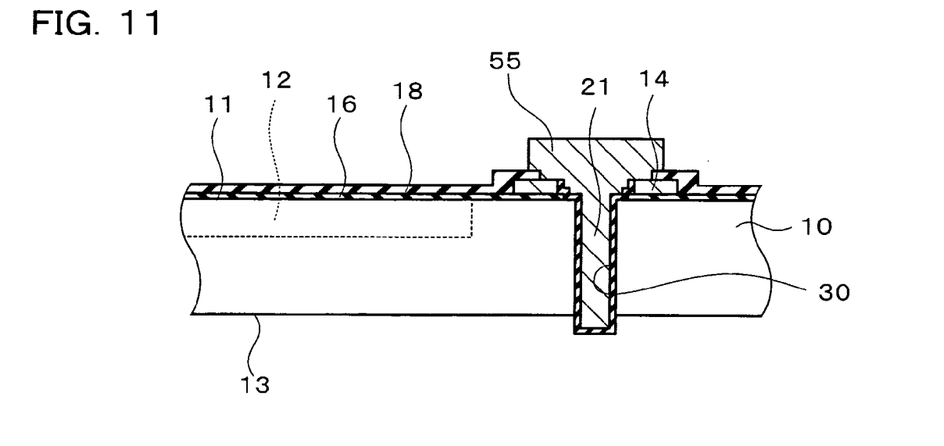
FIG. 11 is a diagram for illustrating a method of manufacturing a semiconductor device according to the first embodiment of the present invention.
Figure 12:
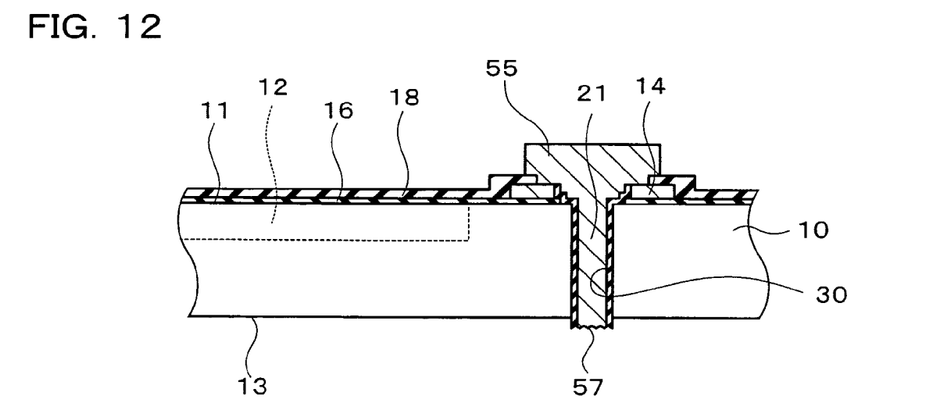
FIG. 12 is a diagram for illustrating a method of manufacturing a semiconductor device according to the first embodiment of the present invention.

Note that the step of forming the conductive section is not limited to the above description and various modifications are possible. As shown in FIG. 11, the conductive section 55 may be formed so that the insulating film 30 is filled with the conductive section 55. In other words, the conductive section 55 may be formed so as not to have a void. As shown in FIG. 12, the end surface 57 may be made uneven to include a plurality of recesses. The end surface 57 may be made more uneven than the other end surface of the conductive section 55. Part of the end surface of the conductive section 55 may be removed to make the end surface 57 uneven by etching, for example. This also produces a plurality of recesses, so that a semiconductor device having the above-described effect can be manufactured.

Second Embodiment

A method of manufacturing a semiconductor device according to a second embodiment to which the present invention is applied is described below. In the present embodiment, the above description is applied as far as possible.

FIGS. 13 to 18 are diagrams showing a method of manufacturing a semiconductor device according to the second embodiment to which the present invention is applied. The semiconductor substrate 10 is provided. The above description may be applied to the semiconductor substrate 10. Specifically, the semiconductor substrate 10 includes the integrated circuit 12. The semiconductor substrate 10 may include the pad 14 electrically connected with the integrated circuit 12. The insulating layers 16 and 18 may be formed on the semiconductor substrate 10 (see FIG. 1).

Figure 13:
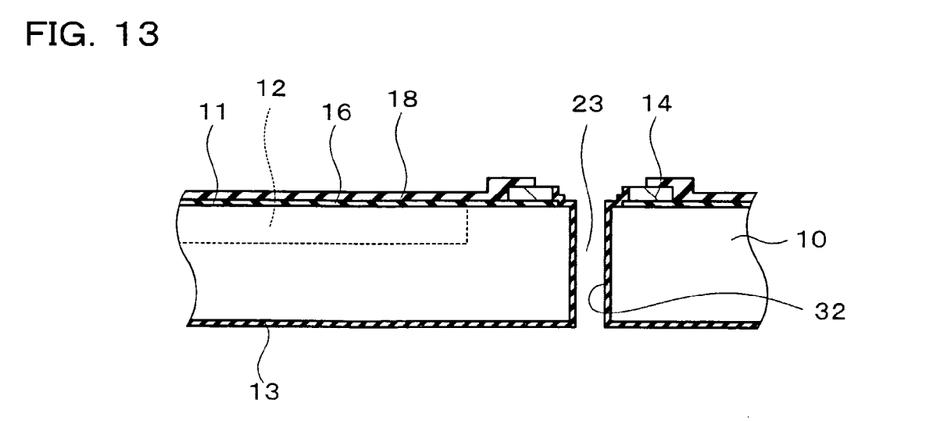
FIG. 13 is a diagram for illustrating a method of manufacturing a semiconductor device according to the second embodiment of the present invention.
Figure 14A:
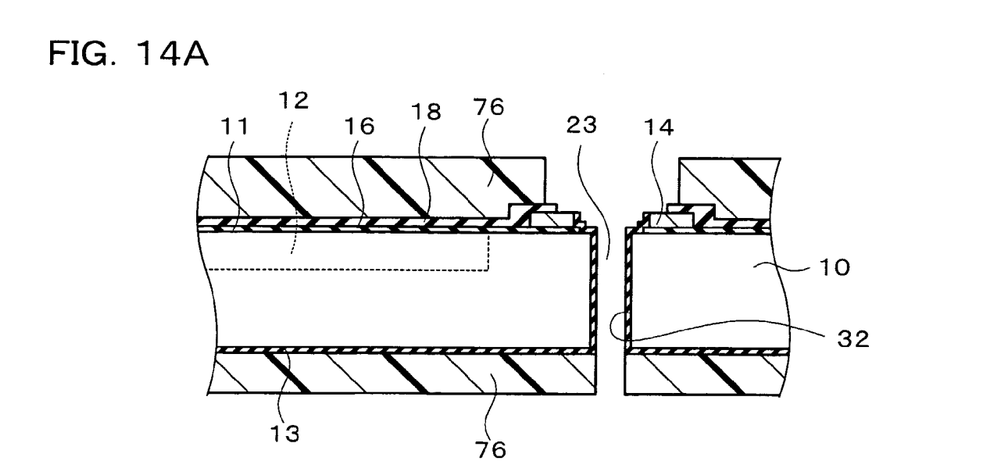
FIGS. 14A and 14B are diagrams for illustrating a method of manufacturing a semiconductor device according to the second embodiment of the present invention.
Figure 14B:
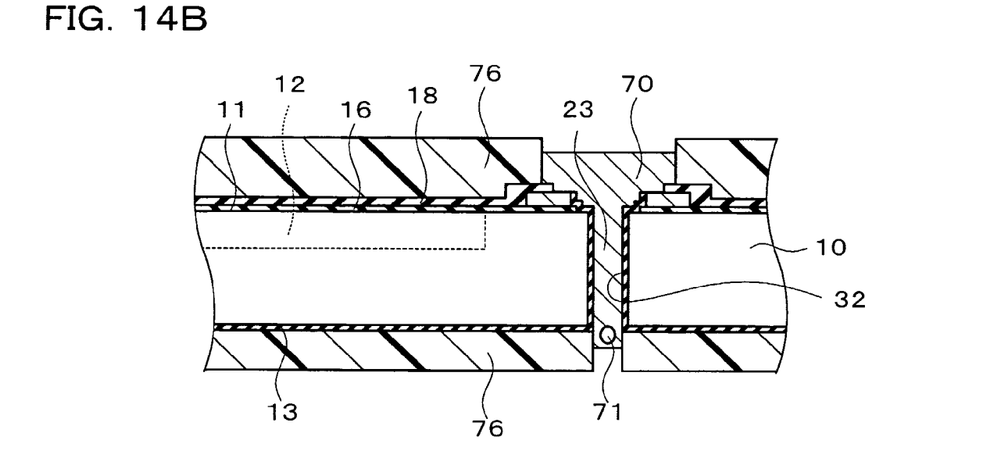
Figure 15:
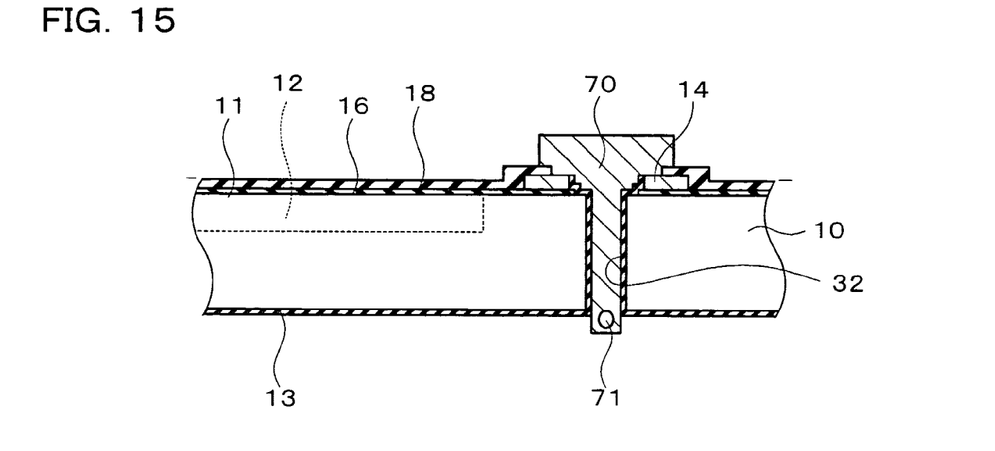
FIG. 15 is a diagram for illustrating a method of manufacturing a semiconductor device according to the second embodiment of the present invention.

A hole 23 is formed in the semiconductor substrate 10 (see FIG. 13). The hole 23 is formed through the semiconductor substrate 10. Therefore, the hole 23 may be called a penetrating hole. As a method for forming the hole 23, the above-described method for forming the hole 20 in the semiconductor substrate 10 may be used.

As shown in FIG. 13, an insulating layer 32 may be formed on the inner surface of the hole 23. The description of the insulating layer 30 may be applied to the insulating layer 32. In the present embodiment, the insulating layer 32 may be formed in the region including the second surface 13 (see FIG. 13).

A conductive section 70 is formed. The conductive section 70 is formed through the semiconductor substrate 10 while passing inside the insulating layer 32. For example, a patterned resist 76 may be formed after forming a conductive film (not shown) (see FIG. 14A), and the conductive section 70 may be formed by electroplating (see FIG. 14B). The conductive section 70 may be formed by removing a part of the resist 76 and the conductive film (see FIG. 15). The step of forming the conductive section 70 is not limited thereto. Any of conventional methods may be applied. The conductive section 70 may be formed to have a void 71 inside the conductive section 70.

Figure 16:
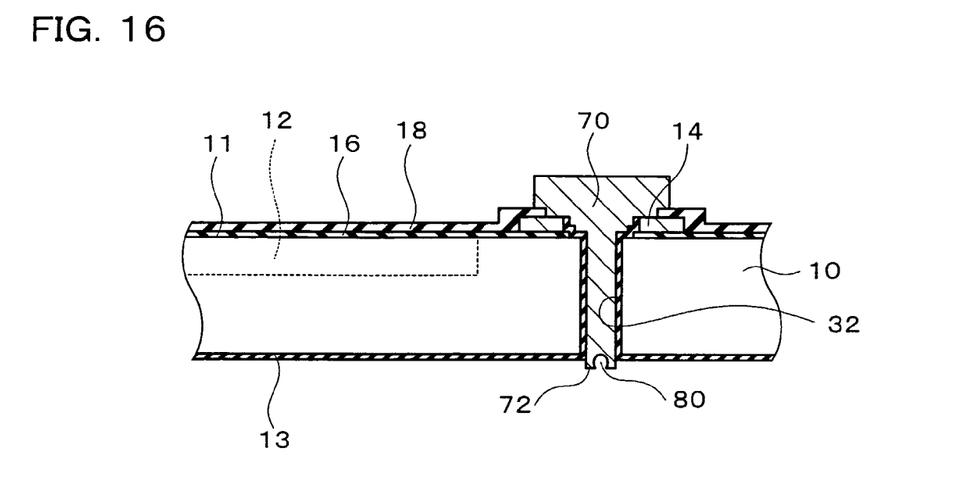
FIG. 16 is a diagram for illustrating a method of manufacturing a semiconductor device according to the second embodiment of the present invention.

As shown in FIG. 16, a recess 80 is formed on an end surface 72 of the conductive section 70. The recess 80 may be formed by removing a part of the conductive section 70 from the side of the end surface 72 to open the void 71.

A semiconductor device according to an embodiment to which the present invention is applied may be manufactured by the above-described steps. A semiconductor device having an effect the same as the effect of the semiconductor device 1 can be manufactured by applying the method of manufacturing the semiconductor device according to the present embodiment.

Figure 17:
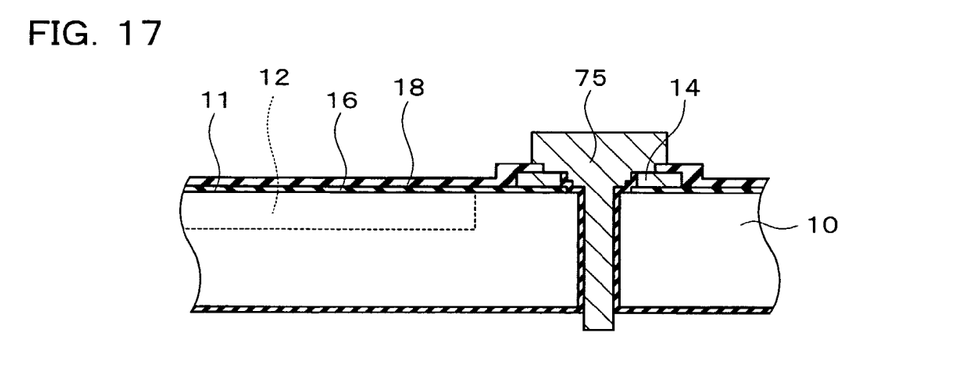
FIG. 17 is a diagram showing a modification of a method of manufacturing a semiconductor device according to a modification of the second embodiment to which the present invention is applied.
Figure 18:
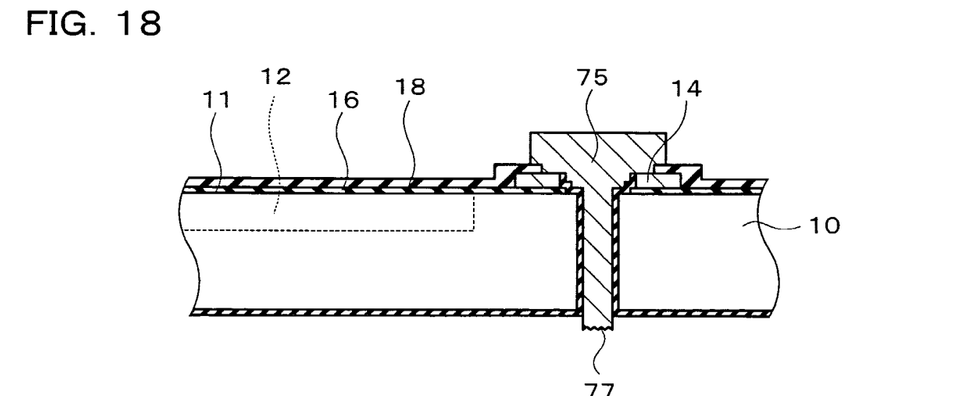
FIG. 18 is a diagram showing a modification of a method of manufacturing a semiconductor device according to a modification of the second embodiment to which the present invention is applied.

As a modification, the conductive section 75 may be formed so as not to have the void 71 as shown in FIG. 17, and the end surface 77 of the conductive section 75 may be made uneven to include a plurality of recesses, as shown in FIG. 18. In other words, a recess may be formed on the end surface 77 by making the end surface uneven. The end surface 77 may be made more uneven than the other surface of the conductive section 70. This also produces a recess on the end surface 77, so that a semiconductor device having an effect the same as the effect of the semiconductor device 1 can be manufactured.

The present invention is not limited to the above-described embodiments, and various modifications and variations can be made. For example, the present invention includes various other configurations substantially the same as the configurations described in the embodiments (in function, method and effect, or in objective and effect, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations described in the embodiments.

What is claimed is:

1. A semiconductor device comprising:
    a semiconductor substrate having an integrated circuit and a penetrating hole;
    an insulating layer formed on an inner surface of the penetrating hole; and
    a conductive section formed on the insulating layer to penetrate the semiconductor substrate and having a recess on an end surface,
    wherein the recess has an internal space the width of which is larger than the width of an opening of the recess; and
    wherein the recess is formed not to penetrate entirely through the conductive section.

2. The semiconductor device as defined in claim 1, wherein:
    a pad electrically connected to the integrated circuit is formed on a first surface of the semiconductor substrate; and
    the end surface is exposed from a second surface of the semiconductor substrate opposite to the first surface.

3. The semiconductor device as defined in claim 1, wherein the end surface is an uneven surface including a plurality of the recesses.

4. The semiconductor device as defined in claim 3, wherein the end surface is more uneven than the other end surface of the conductive section.

5. The semiconductor device as defined in claim 1, wherein: an end portion of the conductive section having the end surface including the recess projects from the semiconductor substrate; and
the recess has such a depth that a bottom of the recess is positioned inside the semiconductor substrate.

6. A stacked semiconductor device comprising:
a plurality of the semiconductor devices as defined in claim 1 which are stacked,
wherein electrical connection of the semiconductor devices are achieved through the conductive sections.

7. The stacked semiconductor device as defined in claim 6, further comprising:
a conductive material which partially enters the recesses to connect the conductive sections of vertically adjacent semiconductor devices among the semiconductor devices.

8. A circuit board on which is mounted the semiconductor device as defined in claim 1.

9. An electronic instrument comprising the semiconductor device as defined in claim 1.

10. A method of manufacturing a semiconductor device, comprising:
(a) forming a penetrating hole in a semiconductor substrate which has an integrated circuit;
(b) forming an insulating layer on an inner surface of the penetrating hole;
(c) forming a conductive section on the insulating layer to penetrate the semiconductor substrate; and
(d) forming a recess on an end surface of the conductive sections,
wherein the recess has an internal space the width of which is larger than the width of an opening of the recess; and
wherein the recess is formed not to penetrate entirely through the conductive section.

11. The method of manufacturing a semiconductor device as defined in claim 10, wherein:
the hole is formed so as not to penetrate the semiconductor substrate in the step (a); and
the end surface is exposed from the semiconductor substrate after the step (c).

12. The method of manufacturing a semiconductor device as defined in claim 10, wherein:
a pad electrically connected to the integrated circuit is formed on a first surface of the semiconductor substrate; and
the end surface is exposed from a second surface of the semiconductor substrate opposite to the first surface.

13. The method of manufacturing a semiconductor device as defined in claim 10, wherein:
the conductive section is formed to have a void in the step (c); and
the recess is formed by removing part of the end surface of the conductive section and opening the void in the step (d).

14. The method of manufacturing a semiconductor device as defined in claim 10,
wherein the recess is formed to have an internal space the width of which is larger than the width of an opening of the recess in the step (d).

15. The method of manufacturing a semiconductor device as defined in claim 10,
wherein the end surface is made uneven to have a plurality of the recesses in the step (d).

16. The method of manufacturing a semiconductor device as defined in claim 15,
wherein the end surface is made more uneven than the other end surface of the conductive section in the step (d).

17. The method of manufacturing a semiconductor device as defined in claim 10, wherein:
an end portion of the conductive section having the end surface including the recess projects from the semiconductor substrate; and
the recess is formed to have such a depth that a bottom of the recess is positioned inside the semiconductor substrate in the step (d).

18. The method of manufacturing a semiconductor device as defined in claim 10,
wherein the step (d) includes removing part of the end surface by etching.

19. The method of manufacturing a semiconductor device as defined in claim 10, wherein:
the semiconductor substrate is a semiconductor wafer including a plurality of integrated circuits;
the hole is formed for each of the integrated circuits; and
the semiconductor substrate is cut after the step (d).

20. A method of manufacturing a stacked semiconductor device, comprising:
stacking a plurality of semiconductor devices each of which includes: a semiconductor substrate having an integrated circuit and a penetrating hole; an insulating layer formed on an inner surface of the penetrating hole; and a conductive section formed on the insulating layer to penetrate the semiconductor substrate and having a recess on an end surface; and
achieving electrical connection of the semiconductor devices through the conductive sections;
wherein the recess is formed not to penetrate entirely through the conductive section; and
wherein the recess has an internal space the width of which is larger than the width of an opening of the recess.

21. The method of manufacturing a stacked semiconductor device as defined in claim 20,
wherein a conductive material partially enters the recesses to connect the conductive sections of vertically adjacent semiconductor devices among the semiconductor devices.

* * * * *